United States Patent [19]
Michiels et al.

[11] Patent Number: 5,536,817
[45] Date of Patent: Jul. 16, 1996

[54] TYPE OF MODIFIED GELATIN AND ITS USE IN A DTR MATERIAL

[75] Inventors: Eddy Michiels, Duffel; Piet Kok, Gent; Johan Loccufier, Zwijnaarde; Frank Michiels, Aaendonk; Ludo Van Rompuy, Destelbergen, all of Belgium

[73] Assignee: AGFA-GEVAERT, N.V., Mortsel, Belgium

[21] Appl. No.: 520,990

[22] Filed: Aug. 30, 1995

Related U.S. Application Data

[62] Division of Ser. No. 249,723, May 26, 1994, Pat. No. 5,474,885.

[30] Foreign Application Priority Data

Jun. 11, 1993 [EP] European Pat. Off. ............. 93201687

[51] Int. Cl.$^6$ ............................. G03C 1/047; G03F 7/07
[52] U.S. Cl. ........................ 530/408; 430/204; 430/230; 530/409; 530/354
[58] Field of Search .................................... 430/204, 230, 430/642; 530/354, 409, 408

[56] References Cited

U.S. PATENT DOCUMENTS

| | | | |
|---|---|---|---|
| 3,539,353 | 11/1970 | Gates et al. | 430/642 |
| 4,021,245 | 5/1977 | Nagatomo et al. | 430/642 |
| 5,219,992 | 6/1993 | Specht et al. | 530/354 |
| 5,391,477 | 2/1995 | Weatherill | 530/354 |

*Primary Examiner*—Richard L. Schilling
*Attorney, Agent, or Firm*—Breiner & Breiner

[57] ABSTRACT

A modified gelatin is disclosed wherein part of the free carboxyl groups is replaced by modifiers having more acid end-standing groups chosen from —$SO_3M$, —$OSO_3M$, —$SSO_3M$, —$OPO(OH)_2$, —$OPO(OH)(OR^2)$, —$PO(OH)_2$, —$PO(OH)(OR^2)$.

In a preferred embodiment such a modified gelatin is incorporated in a DTR photographic material which after processing can serve as a lithographic printing plate. Thanks to the more hydrophilic character of the modified gelatin the differentiation between printing and non-printing areas is improved and toning at printing start-up is reduced.

3 Claims, No Drawings

TYPE OF MODIFIED GELATIN AND ITS USE IN A DTR MATERIAL

This is a division of application Ser. No. 08/249,723 filed May 26, 1994, now U.S. Pat. No. 5,474,885.

FIELD OF THE INVENTION

The present invention relates to a new type of modified gelatin, to photographic materials containing it, and to a method for making a lithographic printing plate according to the silver salt diffusion transfer process improved for differentiation between printing areas and non-printing areas.

BACKGROUND OF THE INVENTION

The principles of the silver complex diffusion transfer reversal process, hereinafter called DTR-process, have been described in e.g. U.S. Pat. No. 2,352,014 and in the book "Photographic Silver Halide Diffusion Processes" by Andre Rott and Edith Weyde—The Focal Press—London and New York (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background. For example, typical lithographic printing plates are disclosed in e.g. EP-A-423399 and EP-A-410500.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

As for other printing plates it is required that the printing plates obtained according to the DTR-process have a good ink acceptance in the printing areas and no ink acceptance in the non-printing areas (no staining). It is furthermore desirable that the number of copies that have to be disposed of because of ink acceptance in the non-printing areas (so called toning) during start-up of the printing process is limited.

It will be readily understood by those skilled in the art that any measure which would render the non-printing background areas more hydrophilic would be beneficial in avoiding the problem of toning. While the surface of the printing areas consists of hydrophobized DTR-silver the surface of the non-printing background areas is a gelatin surface. So it can be expected that measures rendering the gelatin surface more hydrophilic would be advantageous in avoiding toning. In this context the concept of a modified gelatin comes to aid.

As generally known to those skilled in the art gelatin is prepared from collagen. Details on the preparation of gelatin are described in e.g. "the Science and Technology of Gelatin" A. G. Ward and A. Courts, Academic Press 1977, p. 295. Gelatin consists of a three-dimensional network of polypeptide chains. Each polypeptide chain is built-up by repeating units of about twenty different amino acids linked together by peptide bonds. The dicarboxylic amino acids, i.c. aspartic acid and glutamic acid, provide the free (unbonded) carboxyl groups in the polypeptide chain, while the free amino groups are provided by amino acids, containing more than one amino group, e.g. lysine and arginine. Free carboxylic groups and free amino groups can act as so-called functional groups in several chemical reactions, e.g. modification reactions and hardening reactions. The ratio of free carboxylic and free amino groups determines the so-called isoelectric point, the pH at which the gelatin molecule is electrically neutral, Scientific and patent literature is replete with references concerning gelatin modifications chemically applied on the free primary amino functions. For instance, different types af acylated gelatins are disclosed in U.S. Pat. No. 2,525,753, U.S. Pat. No. 2,827,419, U.S. Pat. No. 3,486,896 and U.S. Pat. No. 3,763,138. Phtaloyl gelatins are described in U.S. Pat. No. 2,725,293and BE 840,437. Reaction of gelatin with compounds containing active halogen atoms are disclosed in BE 614,426 and BE 1,005,787.

On the other hand disclosures concerning modification on the free carboxyl group are scarce. However such a modification type theoretically would offer several benefits: there are about three times more free carboxyl groups than free primary amino groups offering the possibility of a substantially higher degree of modification, while the latter would remain available for other reactions, e.g. hardening. In U.S. Pat. No. 4,238,480 different reagents, a.o. ethylenediamine, are used to modify collagen into a substance with a more electropositive surface, which is used as a hemostatic agent. In International Application PCT/US91/04197, published as WO 91/20014, a gelatin is disclosed which is modified by reaction on part of the free carboxyl groups in the presence of (i) an "amide bond forming agent" and (ii) a well-defined type of diamine, triamine or cyclic diamine, e.g. piperazine. In this way additional end-standing amino functions were introduced in the gelatin molecule, which, moreover, proved to be more reactive to vinylsulphonyl hardeners, a common type of hardeners for gelatin, than the original ones. In this way multilayer photographic elements can be designed which show so-called differential hardness.

European Patent Application, filed 8 Mar., 1993, as application No. 93200655 discloses other types of carboxyl group modified gelatin and their use in photographic elements.

The present invention constitutes a further extension on the teachings of modified gelatins cited above be it that the context and objects are quite different.

It is an object of the present invention to provide new types of modified gelatin which show a more hydrophilic character than conventional unmodified gelatin.

It is a further object of the present invention to provide a photographic element, in particular a photographic DTR element, containing such a new type of modified gelatin.

It is a further object of the present invention to provide a DTR element serving as a planographic printing plate having good printing properties with no staining and less toning during start

SUMMARY OF THE INVENTION

The objects of the present invention are realized by providing a modified gelatin according to general formula (I) or (II):

Gel—CO—NR$^1$—L—X   (I)

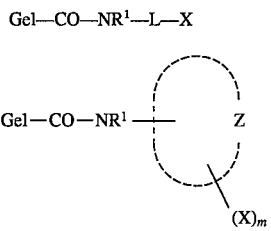
(II)

wherein

Gel is a gelatin polypeptide, —CO— is a carbonyl group from part of2 the free carboxyl groups originally present in an aspartic acid or glutamic acid moiety in said gelatin polypeptide, R$^1$ represents hydrogen, substituted or unsubstituted alkyl, substituted or unsubstituted aryl, substituted or unsubstituted cycloalkyl, X is a moiety selected from the group consisting of: —SO$_3$M, —OSO$_3$M, —SSO$_3$M, —OPO(OH)$_2$, —OPO(OH)(OR$^2$), —PO(OH)$_2$, —PO(OH)(OR$^2$), wherein M is hydrogen or a cation, and R$^2$ is lower alkyl, L represents an alkylene moiety, which can be further substituted by substituted or unsubstituted alkyl, substituted or unsubstituted aryl, substituted or unsubstituted cycloalkyl, one or more pairs of said substituents on said alkylene moiety can combine together to form a ring, and wherein said alkylene moiety can be interrupted by one or more heteroatoms;

Z represents the atoms to close a cycloaliphatic, aromatic carbocyclic, or aromatic or non-aromatic heterocyclic ring, and m is 1 to 4, In a preferred embodiment of the invention the modified gelatin is incorporated in at least one of the hydrophilic layers of a photographic material, more particularly a photographic DTR material which constitutes a planographic printing plate after processing. It was found that on printing with such a material the differentiation between printing and non-printing areas was improved resulting in less toning during start-up. This was especially the case when rather acid fountain solutions were used with a pH of about 5.0 or less.

DETAILED DESCRIPTION OF THE INVENTION

The modification involves reaction of part of the free carboxyl groups of the gelatin polypeptide chain. The preparation procedure is basically the same as described in WO 91/20014. The reaction mixture contains gelatin, an "amide bond forming agent", and a modifying agent of one of general formulas:

NHR$^1$—L—X, or

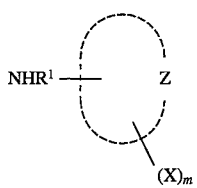

wherein the substituents have the same meaning as defined above.

In a first stage a free carboxyl reacts with the "amide bond forming agent" to form a so-called "activated carbonyl group". Then the "amide bond forming agent" is replaced by the modifying agent moiety under formation of an amide bond, which is a stable bond that will not readily be hydrolyzed.

The amide bond forming agents for use in this invention can include, for example, carbodiimides as described in *Berichte der Deutschen Chemischen Gesellschaft*, Vol. 71 II p. 1933 (1938), and *Bull. Soc. Chem. France*, p.1360 (1956); dihydroquinone compounds as disclosed in DE 2322317; carbamoylpyridinium salts as disclosed in DE 2225230, DE 2317677 and DE 2439551; carbamoyloxypyridinium salts as described in DE 2408814; and amidinium ether compounds as claimed in U.S. Pat. No. 4,877,724.

Other coupling reagents giving rise to active intermediates in amide bond formation include alkoxyacethylenes as described in *Rec. Trav. Chem. Pays-Bas*, Vol 74, 1955, p. 769, dihydroquinolines as described in *J. Am. Chem. Soc.*, Vol.90, 1968, p. 1651, diphenylketenes and derivatives as disclosed in *Chem. Ber.* Vol. 94, 1961, p. 1762 and *J. Am. Chem. Soc.* Vol. 80, 1958, p. 4065, carbodiimidazoles as described in *Liebigs Ann. Chem.*, Vol. 609, 1957, p. 75, and acyloxy-phosphonium salts as disclosed in *Helv. Chim. Acta*, Vol. 58, 1975, p. 688. Still other coupling reagents are listed in M. Bodanszky, *Principles of Peptide Synthesis*, Springer. Verlag 1984, pp. 45–46.

Preferred amide bond forming compounds are carbamoylpyridinium and carbamoyloxypyridinium salts. A most useful compound (see preparative examples furtheron) is:

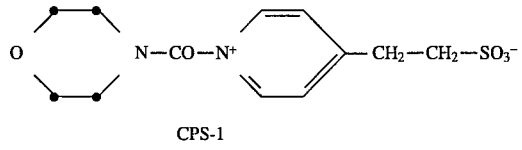

CPS-1

These preferred amide bond forming agents are themselves fast acting hardeners for gelatin. Indeed, after activation by the amide bond forming agent of a free carboxylic group an amide bond can readily be formed with a free amino function on the same or another polypeptide chain. This results in a raise of the high-molecular mass fraction and cross-linking of the gelatin. In the modification process this cross-linking is an unwanted side reaction which ought to be suppressed. This can be done by establishing in the reaction mixture a low concentration of gelatin, preferably about 1 to 3% by weight, and a high excess of modifying agent. By doing so the activated carbonyl group will react more readily with a modifier molecule than with a free lysine or arginine amino group. Preferred modifying agents for the preparation of the modified gelatin types of the present invention include following compounds:

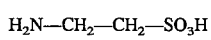

taurine (M-1)

H₂N—CH₂—CH₂—O—SO₃H 2-aminoethyl-sulphuric acid (M-2)

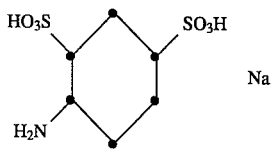

4-aminobenzene-1,3-disulphonic acid sodium salt (M-3)

$$\begin{array}{c} OH \\ | \\ O=P-O-CH_2-CH_2-NH_2 \\ | \\ OH \end{array}$$

2-aminoethyl dihydrogen phosphate (M-4)

Other useful modifying agents include:
aminomethane sulphonic acid;
aminosulphonylic acid;
4-aminocyclohexane sulphonic acid;
5-amino-3-oxapentane sulphonic acid;
di(2-sulphoethyl)amine;
4-sulphopiperidine;
2-aminomethyl-ethane sulphonic acid;
4-(4-aminophenoxy)-butane sulphonic acid;
1-amino-3,5-di(sulphoethoxy)-benzene;
3-aminophenyl hydrogen sulphate;
2-aminomethyl-ethyl hydrogen sulphate
4-aminocyclohexyl hydrogen sulphate;
5-amino-3-thia-pentyl hydrogen sulphate;
1-amino-3,5-(hydroxysulphenyloxy)benzene;
4-aminophenyl dihydrogen phophate;
3-aminocyclohexyl dihydrogen phosphate;
aminomethyl phosphonic acid;
2-aminoethylphosphonic acid methylester;
di(2-phosphonoethyl)amine;
1-amino-2,4-diphosphono-benzene;
S-2-aminoethyl hydrogen thiosulphate;
S-3-aminophenyl hydrogen thiosulphate;
S-5-amino-3-oxapentyl hydrogen thiosulphate;

The reaction is performed in an aqueous medium preferably containing 1% to about 15% of gelatin. The start gelatin can be any type of conventional gelatin, e.g. low-viscosity, medium-viscosity or high-viscosity type gelatin; the viscosity typically ranges from 8 to 60 mPas (values for a 10% aqueous solution at 40° C., measured by a Haake Rotovisco RV2 viscosimeter with sensor system NV at a shear rate of 1000 s⁻¹). The gelatin can either be free of Calcium or contain Calcium (typical up to 0.55%). In principle gelatin can be used which is already partially modified in some way.

The amide bond forming agent is added in an amount preferably between 0.01 and 2 equivalents with regard to the free carboxyl groups present, depending on the desired degree of modification. The modifying agent is present in an amount preferably equivalent with 2 to 10 times the amount of amide bond forming agent. The modifying agent is preferably added before the amide bond forming agent. For reasons explained earlier a rather low concentration of gelatin and a rather high excess of modifying agent are preferred. The reaction is preferably conducted at ambient pressure at 40° C.–80° C., for 5 minutes to about 24 hours. The initial pH is preferably established between 5.0 and 5.5. After the modification reaction is finished the resulting material is washed thoroughly, preferably by ultrafiltration, in order to remove unreacted starting reagents and low-molecular weight by-products.

A modified gelatin can be characterized in various ways. An important parameter is the degree of modification expressed as the percentage of free carboxyl groups modified. From knowledge of the amount of milli-equivalents free carboxyl groups in the original gelatin and from the concentration of the reagents, the theoretical maximal percentage of carboxyl groups modified can be calculated. The actually obtained degree of modification can be determined from an acid—base titration. From these two values the yield of the modification can be calculated.

In principle the new type of modified gelatin can be present in a one-layer hydrophilic coating or in all the layers of a multilayer hydrophilic element, e.g. a photographic element. The benefits of the present invention however become particularly clear when the new types of modified gelatin are incorporated in one or more of the hydrophilic layers of a photographic DTR element, and more particularly a mono-sheet DTR element. By processing such a material is transformed into a lithographic printing plate. It will be readily understood that the newly introduced end-standing X moieties will lower the iso-electric point of the gelatin because of their more acid character (lower $pK_a$) compared to the original free carboxyl groups which they have partially replaced. For instance, carboxyl groups in gelatin have a $pK_a$ of 4.2 while the $pK_a$ of sulphonic acid groups introduced in modified gelatin is estimated at about 1.5. Given these values it can be easily calculated that at pH 5.5 the fraction of undissociated carboxyl groups is 5%, at pH 5.0 it is 14% and at pH 4.7 it is 24%, while sulphonic acid groups are fully dissociated at all three pH values. As a result sulphonyl modified gelatin will contain a substantially greater fraction of dissociated acid groups at pH 5.0 or lower than unmodified gelatin. It is believed that such greater fraction of dissociated groups renders the gelatin more hydrophilic, probably in view of the polar character of the water molecule, vis-a-vis aqueous fountain solutions which often have a pH of 5.0 or even lower in practical printing conditions. Since in the printing areas the hydrophobic character of the DTR silver image is unchanged when using modified gelatin compared to unmodified gelatin, the differentiation between printing areas and non-printing areas is improved and the toning problem at printing start-up is reduced.

The composition of the silver halide emulsion incorporated in a photographic element of the present invention is not specifically limited and may be any composition selected from e.g. silver chloride, silver bromide, silver iodide, silver chlorobromide, silver bromoiodide, and silver chlorobromoiodide. In the preferred case of a DTR mono-sheet material the emulsion layer preferably consists of a single layer but principally a double layer pack or a multiple layer pack are possible. Each layer can contain one emulsion or a mixture of several emulsions. In the case of DTR the emulsion(s) preferably consist(s) principally of silver chloride but a fraction of silver bromide preferably ranging from 0 to about 40 mole % and/or a fraction of silver iodide preferably ranging from 0 to 10 mole % can be present. The bromide and iodide can be homogeneously distributed over the silver halide grain volume or inhomogeneously distributed, e.g. in a so-called core-shell form. The emulsion grains can further contain one or more dopants preferably elements of group VIII of the Periodic System, e.g. Rhodium or Iridium.

The photographic emulsion(s) can be prepared from soluble silver salts and soluble halides according to different methods as described e.g. by P. Glafkidès in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966)

Two or more types of silver halide emulsions that have been prepared differently can be mixed to form a photographic emulsion. The average size of the silver halide grains may range from 0.05 to 1.0 micron, preferably from 0.2 to 0.5 micron. The size distribution of the silver halide particles can be homodisperse or heterodisperse.

The light-sensitive silver halide emulsions are preferably chemically sensitized as described e.g. in the above-mentioned "Chimie et Physique Photographique" by P. Glafkides, in the above-mentioned "Photographic Emulsion Chemistry" by G. F. Duffin, in the above-mentioned "Making and Coating Photographic Emulsion" by V. L. Zelikman et al, and in "Die Grundlagen der Photographischen Prozesse mit Silberhalogeniden" edited by H. Frieser and published by Akademische Verlagsgesellschaft (1968).

The light-sensitive silver halide emulsions can be spectrally sensitized with methine dyes such as those described by F. M. Hamer in "The Cyanine Dyes and Related Compounds", 1964, John Wiley & Sons. Dyes that can be used for the purpose of spectral sensitization include cyanine dyes, merocyanine dyes, complex cyanine dyes, complex merocyanine dyes, hemicyanine dyes, styryl dyes and hemioxonol dyes. Particularly valuable dyes are those belonging to the cyanine dyes, merocyanine dyes and complex merocyanine dyes.

The silver halide emulsion(s) for use in accordance with the present invention may comprise compounds preventing the formation of fog or stabilizing the photographic characteristics during the production or storage of photographic elements or during the photographic treatment thereof. Many known compounds can be added fog-inhibiting agent or stabilizer to the silver halide emulsion.

The photographic element of the present invention may further comprise various kinds of surface-active agents in the photographic emulsion layer or in another hydrophilic colloid layer. Suitable surface-active agents include non-ionic agents such as saponins, alkylene oxides e.g. polyethylene glycol, polyethylene glycol/polypropylene glycol condensation products, polyethylene glycol alkyl ethers or polyethylene glycol alkylaryl ethers, polyethylene glycol esters, polyethylene glycol sorbitan esters, polyalkylene glycol alkylamines or alkylamides, silicone-polyethylene oxide adducts, glycidol derivatives, fatty acid esters of polyhydric alcohols and alkyl esters of saccharides; anionic agents comprising an acid group such as a carboxy, sulpho, phospho, sulphuric or phosphoric ester group; ampholytic agents such as aminoacids, aminoalkyl sulphonic acids, aminoalkyl sulphates or phosphates, alkyl betaines, and amine-N-oxides; and cationic agents such as alkylamine salts, aliphatic, aromatic, or heterocyclic quaternary ammonium salts, aliphatic or heterocyclic ring-containing phosphonium or sulphonium salts. Such surface-active agents can be used for various purposes e.g. as coating aids, as compounds preventing electric charges, as compounds improving slidability, as compounds facilitating dispersive emulsification, as compounds preventing or reducing adhesion, and as compounds improving the photographic characteristics e.g. higher contrast, sensitization, and development acceleration.

The photographic material in connection with the present invention preferably will be hardened in order to avoid physical damage. Hardening agents include those of the epoxide type, those of the ethylenimine type, chromium salts e.g. chromium acetate and chromium alum, aldehydes e.g. formaldehyde, glyoxal, and glutaraldehyde, N-methylol compounds e.g. dimethylolurea and methyloldimethylhydantoin, dioxan derivatives e.g. 2,3-dihydroxy-dioxan, active vinyl compounds e.g. 1,3,5-triacryloyl-hexahydro-s-triazine, active halogen compounds e.g. 2,4-dichloro-6-hydroxy-s-triazine, and mucohalogenic acids e.g. mucochloric acid and mucophenoxychloric acid. These hardeners can be used alone or in combination. Among the chemical classes of hardeners an especially useful class is formed by the olefinic hardeners, and more particularly by the vinylsulphonyl hardeners, e.g. bis(vinylsulphonyl)methane (BVSM). The gelatin can also be hardened with fast-reacting hardeners such as carbamoylpyridinium salts as disclosed in U.S. Pat. No. 4,063,952, as already stated above.

The photographic elements may further comprise various other additives such as e.g. compounds improving the dimensional stability of the photographic element, UV-absorbers, light-absorbing dyes such as filter dyes and anti-halation dyes spacing agents and plasticizers.

We will now further discuss the preferred embodiment where the new types of modified gelatin are incorporated in a DTR mono-sheet element. This can be an activator type of DTR element in case the majority of developing agents is incorporated in the DTR element itself or this can be a development type of DTR element in case the majority of developing agents is situated in the developing solution.

The silver halide developing agent used in the DTR mono-sheet element or/and the developing solution according to the present invention is preferably a p-dihydroxybenzene compound, e.g. hydroquinone, methylhydroquinone or chlorohydroquinone, preferably in combination with an auxiliary developing agent being a 1-phenyl-3-pyrazolidinone-type developing agent and/or p-monomethylaminophenol. Particularly useful auxiliary developing agents are 1-phenyl-3-pyrazolidinone, 1-phenyl-4-monomethyl-3-pyrazolidinone, and 1-phenyl-4,4-dimethyl-3-pyrazolidinone.

In the case of an activator type of DTR element and processing solution, the hydroquinone-type developing agents are present in the DTR element according to the present invention in an amount of 2.0 to 15 mmole/sq.m. 1-Phenyl-3-pyrazolidinone type developing agents may be present in an amount of 0.5 to 5.0 mmole/sq.m. Preferably these developing agents are located partially in the emulsion layer and partially in the image receiving layer or in (a) hydrophylic colloid layer(s) in water-permeable relationship therewith.

In the case of a development type DTR material, the hydroquinone type developing agents are preferably present in the developer in a concentration ranging from 100 mmole/l to 400 mmole/l; the 1-phenyl-3-pyrazolidinone type developing agents may be present in a concentration ranging from 10 mmole/l to 100 mmole/l. Even in the development case, developing agents may be present in the DTR material itself, in the same concentration range as in the activator type or less.

In a preferred embodiment the DTR material is provided with a backing layer at the non-light sensitive side of the support. This layer which can serve as anti-curl layer can contain a.o. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

In a preferred embodiment an intermediate hydrophilic layer, serving as antihalation layer, is provided between the support and the silver halide emulsion layer. This layer can contain light-absorbing dyes for antihalation properties; as alternative finely divided carbon black can be used for the same antihalation purposes, as described in U.S. Pat. No.

2,327,828. On the other hand, in order to gain sensitivity, light reflecting pigments, e.g. titanium dioxide can be present. Further this layer can contain hardening agents, matting agents, e.g. silica particles, and wetting agents.

In the image receiving layer of the DTR material development nuclei are present. Preferred development nuclei are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development-nuclei are salts such as e.g. selenides, polyselenides, polysulphides, mercaptans, and tin (II) halides. Heavy metals, preferably silver, gold, platinum, palladium, and mercury can be used in colloidal form.

The support of the photographic material can be a transparent base, preferably an organic resin support, e.g. cellulose nitrate film, cellulose acetate film, polyvinylacetal film, polystyrene film, polyethylene terephthalate film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a subbing layer. On the other hand the support of the photographic material can be a paper base, preferably a polyethylene or polypropylene coated paper base.

The photographic material in connection with the present invention is exposed in an apparatus according to its particular composition and application, e.g. a conventional process camera containing a conventional light source or a laser containing device.

In case of the preferred embodiment of a DTR material of the activation type the coated and exposed material can be developed by means of a developing solution containing additional developing agents but preferably it is developed by an activator solution containing no developing agents at all. In case of the development type of DTR element the hydroquinone type developing agents are preferably present in the developer, as stated already, in a concentration ranging from 100 mmole/l to 400 mmole/l; the 1-phenyl-3-pyrazolidinone type developing agents may be present in a concentration ranging from 10 mmole/l to 100 mmole/l. The alkaline developing or activator solution can contain as silver halide complexing agent a thiocyanate compound, e.g. alkali thiocyanate or ammonium thiocyanate, or a thiosulphate compound, e.g. sodium or ammonium thiosulphate, or a mixture of thiosulphate and thiocyanate. Further interesting silver halide complexing agents are cyclic imides, preferably combined with alkanolamines, as described in U.S. Pat. No. 4,297,430 and U.S. Pat. No. 4,355,090 and 2-mercaptobenzoic acid derivatives as described in U.S. Pat. No. 4,297,429, preferably combined with alkanolamines or with cyclic imides and alkanolamines. A preferred silver complexing agent is thiocyanate by which the best DTR silver morphology is produced.

The developing or activator solution preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mole/l. Further may be present a thickening agent, e.g. hydroxyethylcellulose or carboxymethylcellulose, fog inhibiting agents, e.g. potassium bromide, potassium iodide and a benzotriazole, calcium-sequestering compounds, anti-sludge agents, and hardeners including latent hardeners. The developing or activator solution can further contain one or more hydrophobizing agents to enhance the ink-receptive properties of the DTR silver image, e.g. those described in U.S. Pat. No. 3,776,728, and U.S. Pat. No. 4,563,410. Preferred compounds are 5-n.heptyl-2-mercapto-1,3,4,-oxadiazol and 3-mercapto-4-acetamido-5-n.heptyl-1,2,4-triazole. Further an inorganic alkali agent, e.g. sodium hydroxide is present in the developing or activator solution to establish a pH value ranging from 12 to 14, preferably at least 12.5. Other alkali agents can be included, e.g. secondary and/or tertiary alkanolamines. Finally, to assure a good spread, the developing or activator solution can contain wetting agents, preferably compounds containing perfluorinated alkyl groups.

The developing or activator solution is followed by a neutralization solution. In order to reduce the pH of the wet swollen DTR element leaving the alkaline activator solution, the neutralization liquid contains buffer ions, e.g. phosphate buffer or citrate buffer to establish in said liquid a pH value ranging from 5.0 to 7.0. The neutralization solution can further contain bactericides, e.g. phenol, thymol or 5-bromo-5-nitro-1,3-dioxan described in European Patent Specification EP 0,150,517, The liquid can also contain substances which influence the hydrophobic/hydrophilic balance of the printing plate obtained after processing of the DTR element, e.g. silica. Finally the neutralization solution can contain wetting agents, preferably compouds containing perfluorinated alkyl groups.

The processing of the DTR material preferably proceeds in an automatically operated apparatus such as RAPILINE 43 SP marketed by Agfa-Gevaert N.V. The DTR-process is normally carried out at a temperature in the range of 10° C. to 35° C. In order to minimize the quality loss due to-bath exhaustion, regenerating liquids can be added preferably automatically in proportion to the consumption of processing liquids.

Commercially available orthochromatically sensitized DTR materials which can be processed to lithographic printing plates are marketed e.g. by Mitsubishi Paper Mills LTD under the trade name SILVERMASTER and by Agfa-Gevaert N.V. under the trade name SUPERMASTER. A similar material red sensitized for HeNe laser exposure and a similar material sensitized to the near infra-red for exposure by a laserdiode are marketed by Agfa-Gevaert N.V. under the trade names SET-NH and SET-IR respectively. The SUPERMASTER film plates were introduced in 1982 in the sheet-fed offset marketplace to meet the increasing demand from the printers. The aim was to provide offset plates quickly and economically, starting from black-and-white art work and without the use of intermediate film. The primary target was black-and-white and monochrome printing with print runs up to 20 000 copies. These offset plate offers excellent compatibility with conventional inks and founts with or without alcohol.

The following examples will illustrate the improvement in hydrophobic/hydrophilic balance, or, in other words, the improvement in differentiation of printing and non-printing areas, when a modified gelatin according to the present invention is introduced in a SUPERMASTER like DTR material.

The examples will illustrate the invention without however being limited to it.

EXAMPLES

1. Preparative examples.

75 g of gelatin was allowed to swell for 30 minutes at room temperature in 2225 g of distilled water and was subsequently dissolved by raising the temperature to 50° C. After one hour an amount of 0.8625 equivalents of taurine (M-1) diluted with distilled water to 500 ml was added to the gelatin solution. The pH was adjusted to 5.2. Then 800 ml of an aqueous solution, containing 0.1725 equivalents of carbamoylpyridinium salt compound CPS-1 (see description), was added to the reaction mixture, which was then allowed to stand at 50° C. for 3 hours. The resulting modified gelatin (sample 1.5 from table 1) was subjected to ultrafiltration in order to eliminate the excess of taurine and the low molecular weight reaction products. Finally, 75 ml of a preservative containing phenol was added before storing the modified gelatin at 5° C.

All other modified gelatins were prepared following a similar procedure. The reaction conditions are summarized in following table 1. The amounts of reagents, in grams and milli-equivalents (meq), were expressed relative to 100 g of gelatin. The reaction time was always 3 hours and the start pH was always 5.2. The modifying agents were:

taurine (M-1);

2-aminoethyl-sulphuric acid (M-2)

4-aminobenzene-1,3-disulphonic acid sodium salt (M-3);

2-aminoethyl dihydrogen phosphate (M-4);

TABLE 1

| No. | conc. gel. | modifier | amount modifier | | amount CPS-1 | |
| --- | --- | --- | --- | --- | --- | --- |
| | | | g | meq | g | meq |
| 1.1 | 2% | M-1 | 11.5 | 92.0 | 5.53 | 18.4 |
| 1.2 | 2% | M-1 | 23.0 | 184.0 | 11.05 | 36.8 |
| 1.3 | 2% | M-1 | 46.0 | 368.0 | 22.1 | 73.6 |
| 1.4 | 2% | M-1 | 72.9 | 575.0 | 34.5 | 115.0 |
| 1.5 | 2% | M-1 | 143.7 | 1150.0 | 69.1 | 230.0 |
| 2.1 | 2% | M-2 | 81.0 | 575.0 | 34.5 | 115.0 |
| 3.1 | 2% | M-3 | 171.0 | 575.0 | 34.5 | 115.0 |
| 4.1 | 2% | M-4 | 80.5 | 575.0 | 34.5 | 115.0 |

2. Characterization of modified gelatins.

The experimentally obtained percentual modification degree was determined by means of an acid—base titration. By comparison with the maximal degree of modification the yield of the modification reaction was calculated.

The results are summarized in table 2.

TABLE 2

| No | % CPS-1 vis-à-vis free —COOH | real % of modif. | yield |
| --- | --- | --- | --- |
| 1.1 | 16% | 11% | 67% |
| 1.2 | 32% | 21% | 66% |
| 1.3 | 64% | 39% | 61% |
| 1.4 | 100% | 56% | 56% |
| 1.5 | 200% | 83% | 83% |
| 2.1 | 100% | 59% | 59% |
| 3.1 | 100% | 49% | 49% |
| 4.1 | 100% | 20% | 20% |

3. Photographic evaluation.

preparation of a control photographic element.

A silver chlorobromide emulsion composed of 98.2% of chloride and 1.8% of bromide was prepared by the double jet precipitation method using conventional gelatin. The average silver halide grain size was 0.4 μm (diameter of a sphere with equivalent volume) and contained Rhodium ions as internal dopant. The emulsion was chemically ripened using conventional sulphur-gold sensitizers and then orthochromatically sensitized, and stabilized by 1-phenyl-5-mercaptotetrazole.

A coating solution for an undercoat layer was prepared having the following composition:

| gelatin | 5.5% |
| --- | --- |
| carbon black | 0.76% |
| silica particles (5 um) | 1.6% |

The emulsion and undercoat coating solutions were simultaneously coated by means of the slide hopper coating technique onto a polyethylene terephtalate support provided with a pack of two backing layers in such a way that the undercoat was positioned between support and emulsion layer. The emulsion layer was coated at a silver halide coverage of 1.5 g of Ag/m$^2$, expressed as AgNO$_3$, and the gelatin at a coverage of 1.34 g/m$^2$. In every preparation stage conventional non-modified gelatin was used. The emulsion layer further contained 0.15 g/m$^2$ of 1-phenyl-4,4'-dimethyl-3-pyrazolidone and 0.25 g/m$^2$ of hydroquinone. The undercoat layer was coated at a gelatin coverage of 3 g/m$^2$.

The layer nearest to the support of the backing layer pack contained 0.3 g/m$^2$ of gelatin and 0.5 g/m$^2$ of the antistatic agent co(tetraallyloxyethane/methylacrylate/acrylic acid-K-salt) polymer. The second backing layer contained 4 g/m$^2$ gelatin, 0.15 g/m$^2$ of hardening agent triacrylformal and 0.021 g/m$^2$ of wetting agent $F_{15}C_7$—COONH$_4$.

The thus obtained element was dried and subjected to a temperature of 40° C. for 5 days and then the emulsion layer was overcoated with a layer containing PdS as physical development nuclei, hydroquinone at 0.4 g/m$^2$ and formaldehyde at 100 mg/m$^2$.

preparation of an invention photographic element.

A DTR element was prepared similar to the control sample with the exception that a fraction of 28% of the gelatin of the emulsion layer was replaced by sulphonated gelatin according to the modified gelatin 1.5 of tables 1 and 2.

The plates obtained were processed in the following solutions

| (a) transfer activator: | |
| --- | --- |
| sodium hydroxide (g) | 30 |
| sodium sulphite anh. (g) | 33 |
| KSCN (g) | 20 |
| 2-mercapto-5-n.heptyl-oxa-3,4-diazole (g) | 0,8 |
| water to make | 1 l |
| (b) neutralization solution: | |
| citric acid (g) | 10 |
| sodium citrate (g) | 35 |
| cysteine (g) | 1 |
| sodium sulphite (g) | 5 |
| phenol (mg) | 50 |
| water to make | 1 l |

Control and invention plates thus obtained were printed on a Heidelberg GTO-52 printing press, using Van Son Rubber base ink and a fountain solution containing 5% of following solution:

| Concentrated fountain solution: | |
| --- | --- |
| sodium hydroxide | 10.5 g |
| citric acid | 26.3 g |
| 5-bromo-5-nitro-1,3-dioxan | 0.35 g |
| ethanol | 7 ml |
| hexylene glycol | 217 ml |

13

-continued

| Concentrated fountain solution: | |
|---|---|
| colloidal silica | 100 ml |
| water to make | 1 l |
| pH = 5.6. | |

Plates with and without sulphonated gelatin were printed adjacently on the same press. Water supply was limited by reducing the Dahlgren dampening system to 50%, thus inducing toning. On the plate containing sulphonated gelatin toning was cleared about 50 sheets sooner than on the non-sulphonated plate. After 100 prints, the finest open line on a solid area was 50 microns wide for the sulfonated plate versus 125 microns wide for the non-sulfonated plate.

It can thus be concluded that the presence of the sulphonated gelatine improves the differentiation between hydrophilic (non-printing) areas and hydrophobic (printing) areas of the offset lithographic plate. It is most likely that this is accomplished by a rise in hydrophilicity of the gelatin binder by the derivatisation with sulphonic acid groups.

EXAMPLES 2–6

Similar printing tests as in example 1 were performed with a series of other DTR elements containing different types of modified gelatin, each time accompanied by a control DTR element containing unmodified gelatin. In table 3 the number of prints necessary for the clearing of toning, and the widths of the finest open lines in a solid area after 50 prints are summarized.

TABLE 3

| | No. prints | width |
|---|---|---|
| control sample | 200 | 75μ |
| sulphonated gelatin 1.5 | 100 | 40μ |
| (85% of gel. in emulsion layer replaced) | | |
| control sample | 250 | 120μ |
| sulphonated gelatin 1.4 | 100 | 40μ |
| (77% of gel. in emulsion layer replaced) | | |
| control sample | 150 | 75μ |
| phosphonated gelatin 4.1 | 100 | 40μ |
| (45% of gel. in emulsion layer replaced) | | |
| control sample | 150 | 150μ |
| disulphonated gelatin 3.1 | 100 | 40μ |
| (64% of gel. in emulsion layer replaced) | | |
| control sample | 200 | no open lines |
| modified gelatin 2.1 | 150 | 120μ |
| (pH of fountain 5.0; 100% of gel. replaced) | | |

14

The results of table 3 clearly illustrate the superiority of the DRT elements containing modified gelatin with regard to their printing properties.

We claim:

1. Modified gelatin according to general formula (I) or (II):

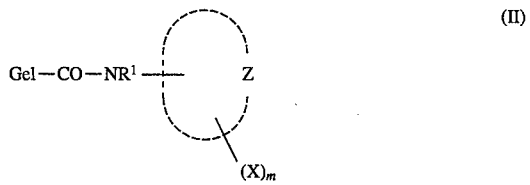

wherein

Gel is a gelatin polypeptide, —CO— is a carbonyl group from part of the free carboxyl groups originally present in an aspartic acid or glutamic acid moiety in said gelatin polypeptide, $R^1$ represents hydrogen, substituted or unsubstituted alkyl, substituted or unsubstituted aryl, substituted or unsubstituted cycloalkyl;

X is a moiety selected from the group consisting of:
—$SO_3M$, —$OSO_3M$, —$SSO_3M$, —$OPO(OH)_2$, —$OPO(OH)(OR^2)$, —$PO(OH)_2$, —$PO(OH)(OR^2)$, wherein M is hydrogen or a cation, and $R^2$ is lower alkyl, L represents an alkylene moiety, which can be further substituted by substituted or unsubstituted alkyl, substituted or unsubstituted aryl, substituted or unsubstituted cycloalkyl, one or more pairs of said substituents on said alkylene moiety can combine together to form a ring, and wherein said alkylene moiety can be interrupted by one or more heteroatoms;

Z represents the atoms to close a cycloaliphatic, aromatic carbocyclic, or aromatic or non-aromatic heterocyclic ring, m is 1 to 4.

2. Modified gelatin according to claim 1 wherein the moiety —$NR^1$—L—X from general formula (I) is derived from taurine by removal of one amino hydrogen.

3. Modified gelatin according to claim 1 wherein the moiety —$NR^1$—L—X from general formula (I) is derived from 2-aminoethyl-sulphuric acid by removal of one amino hydrogen.

* * * * *

UNITED STATES PATENT AND TRADEMARK OFFICE
CERTIFICATE OF CORRECTION

PATENT NO. : 5,536,817
DATED : July 16, 1996
INVENTOR(S) : Eddy Michiels et al

It is certified that error appears in the above-indentified patent and that said Letters Patent is hereby corrected as shown below:

Column 2, line 67, "during start" should read
-- during start-up. --;

Column 3, line 18, "part of2 the free" should read
-- part of the free --;

Column 7, line 33, "can be added fog-inhibiting" should read
-- can be added as fog-inhibiting --;

Claim 1, column 14, Formula (I) is missing. Following
"1. Modified gelatin according to general formula (I) or (II):"
the claim should read -- Gel-CO-NR$^1$-L-X        (I) --.

Signed and Sealed this

Fifth Day of November, 1996

Attest:

Attesting Officer

BRUCE LEHMAN
Commissioner of Patents and Trademarks